(12) United States Patent
Szu

(10) Patent No.: US 7,207,822 B2
(45) Date of Patent: Apr. 24, 2007

(54) LAND GRID ARRAY SOCKET AND METHOD FOR ASSEMBLING THE SAME

(75) Inventor: Ming-Lun Szu, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/288,658

(22) Filed: Nov. 28, 2005

(65) Prior Publication Data

US 2006/0116016 A1 Jun. 1, 2006

(30) Foreign Application Priority Data

Nov. 26, 2004 (TW) .............................. 93219036 U

(51) Int. Cl.
*H01R 13/625* (2006.01)
(52) U.S. Cl. ..................................... 439/342
(58) Field of Classification Search ................ 439/331, 439/342, 259, 73, 343, 261
See application file for complete search history.

(56) References Cited

U.S. PATENT DOCUMENTS

| | | | |
|---|---|---|---|
| 6,485,320 B1* | 11/2002 | Ma ............................ | 439/342 |
| 6,722,909 B1* | 4/2004 | McHugh et al. ............ | 439/331 |
| 6,758,691 B1* | 7/2004 | McHugh et al. ............ | 439/331 |
| 6,780,041 B1* | 8/2004 | Ma ............................ | 439/342 |
| 6,905,357 B2* | 6/2005 | Ma ............................ | 439/331 |
| 6,908,327 B2* | 6/2005 | Ma ............................ | 439/331 |
| 6,948,947 B2* | 9/2005 | Lee et al. ..................... | 439/73 |
| 6,957,973 B1* | 10/2005 | McHugh et al. ............ | 439/331 |
| 6,957,987 B2* | 10/2005 | Ma et al. ................. | 439/733.1 |

* cited by examiner

*Primary Examiner*—Chandrika Prasad
(74) *Attorney, Agent, or Firm*—Wei Te Chung

(57) ABSTRACT

An LGA socket (1) is provided for electrically connecting an IC package to a circuit substrate. The LGA socket includes a housing (2) having a number of conductive terminals (3) and a stiffener (4) formed with a pair of clasping ribs (420) bent inwardly towards the housing disposed around the housing. A load plate (5) having a hook (520) is pivotally attached to the stiffener and moveable relative to the stiffener between an opening position and a closed position. A lever is pivotally connected to the hook. The lever is rotatable with respect to the hook so as to abut against the clasping ribs and successively lock the load plate in position.

15 Claims, 4 Drawing Sheets

LAND GRID ARRAY SOCKET AND METHOD FOR ASSEMBLING THE SAME

BACKGROUND OF THE INVENTION

1. Field of the Invention

The present invention generally relates to the art of electrical connectors and, more particularly to a land grid array (LGA) socket for electrically connecting two electrical interfaces, such as an integrated circuit (IC) package and a circuit substrate.

2. Background of the Invention

An integrated circuit package having conductive pads arranged thereon in a land grid array (LGA) fashion is known as an LGA package. LGA packages are widely used in various electronic devices due to relatively low height and reliable electrical performances.

Electrical connectors for removably mounting an LGA package are known as LGA sockets. Normally, an LGA socket comprises an electrically insulating housing and a plurality of conductive terminals planted in the housing. Each conductive terminal has a spring arm and a terminal section protruding out of opposite external surfaces of the housing. In usage, the spring arm is resiliently urged to electrically engage with a corresponding conductive pad of the LGA package, while the terminal section is electrically connected to the circuit substrate.

When the LGA package is seated on the housing, the conductive pads of the LGA package register with the corresponding conductive terminals. Electrical connection between the conductive terminals and the conductive pads is obtained via elastic deflection and deformation of the spring arms. Thereupon, it is necessary to exert sufficient engaging force on the LGA package to maintain reliable electrical connection between the conductive pads and the conductive terminals.

Heretofore, various LGA sockets to provide the engaging force are disclosed. Typically, an LGA socket includes an electrically insulating housing with a plurality of conductive terminals received therein, a stiffener fittingly attached to a periphery of the housing, and a load plate and a lever pivotally assembled to two opposite ends of the stiffener, respectively. In assembly of the LGA socket, the housing planted with the conductive terminals is fittingly fixed to the stiffener. The load plate and lever are pivotally connected to two opposite ends of the stiffener, respectively.

During the course of mounting the LGA package, the load plate and the lever are rotated away from the housing, respectively. The LGA package is positioned on the insulating housing, with the conductive pads resting on the corresponding conductive terminals. The load plate is rotated with respect to the stiffener to resist the LGA package. The lever is urged to lock the load plate and push the LGA package to move downwardly, thereby providing the engaging force to assure electrical connection between the conductive pads and the conductive terminals.

However, in assembly of the LGA socket, the load plate and the lever are attached to opposite ends of the stiffener, respectively. In mounting of the IC package on the LGA socket, the load plate and the lever also have to be operated, respectively. As a result, it may be inconvenient and complex to assemble the LGA socket and mount an LGA package thereon.

Therefore, there is a heretofore unaddressed need in the industry to address the aforementioned deficiencies and inadequacies.

SUMMARY OF THE INVENTION

According to a preferred embodiment of the present invention, a land grid array (LGA) socket is used to electrically connect an LGA package to a circuit substrate. The LGA socket includes a socket body embedded with a number of conductive terminals and forming a pair of clasping ribs. A load plate having a hook is pivotally attached to the socket body. The load plate is moveable relative to the socket body between an opening position and a closed position. A lever is pivotally connected to the hook. The lever is rotatable with respect to the hook so as to abut against the clasping ribs and successively lock the load plate in position.

During mounting of the LGA package, the load plate with the lever attached thereto is oriented to the opening position. The LGA package is placed on the LGA socket. The load plate is urged to the closed position where the load plate resists an upper surface of the LGA package. The lever pivotally attached to the hook of the load plate is driven to abut against the clasping ribs so as to securely hold the LGA package on the LGA socket. Consequently, it may be preferably convenient and easy to mount the LGA package on the LGA socket.

Other features and advantages of the present invention will become more apparent to those skilled in the art upon examination of the following drawings and detailed description of a preferred embodiment, in which:

DETAILED DESCRIPTION OF THE PREFERRED EMBODIMENT

Figure 1:
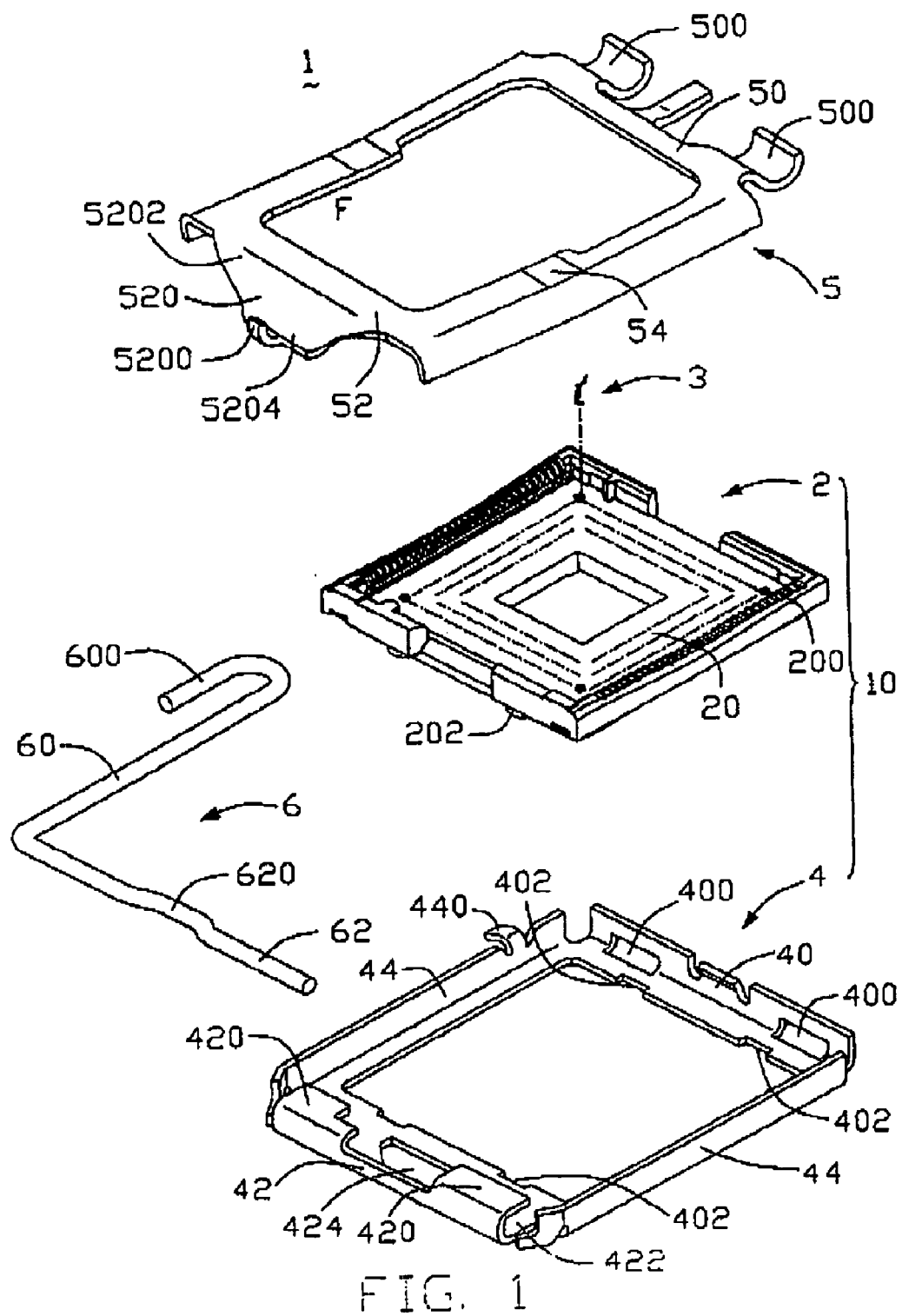
FIG. 1 depicts an exploded, isometric view of an LGA socket in accord with a preferred embodiment of the present invention.

Reference will now be made to describe the preferred embodiment of the present invention in detail.

Referring to FIG. 1 to FIG. 4, an LGA socket 1 in accordance with a preferred embodiment of the present invention is used to electrically connect an LGA package (not shown) and a circuit substrate (not shown). The LGA socket 1 comprises an electrically insulating housing 2 having a plurality of conductive terminals 3 received therein and a stiffener 4 disposed around the housing 2. A load plate 5 is pivotally attached to the stiffener 4 and rotatable relative to the stiffener 4 between an opening position and a closed position. A lever 6 is pivotally connected to the load plate 5 for pressing and successively locking the load plate 5 in the closed position.

Individual elements of the LGA socket 1 will now be described in greater detail. Referring to FIG. 1, the housing 2 is molded from resin or the like and is shaped in the form of a rectangular planar board. The housing 2 has an electric region 20 defining a plurality of passages 200 in a center thereof to receive a plurality of conductive terminals 3 therein. The housing 2 also forms a plurality of positioning columns 202 at outer periphery thereof.

The stiffener 4 is a rectangular metal frame having a front sidewall 40, a rear sidewall 42 and a pair of lateral sidewalls 44 respectively and integrally connecting the front sidewall 40 and the rear sidewall 42. The front sidewall 40 defines a pair of latching slot 400 spaced apart from each other. The rear sidewall 42 forms a pair of clasping ribs 420 bent inwardly toward the front sidewall 40. The clasping ribs 420 and a bottom (not numbered) of the stiffener 4 cooperatively defines a receiving space 422 for holding the lever 6. One of the lateral sidewalls 44 is formed with a locking block 440 for holding the lever 6 thereunder. The bottom of the stiffener 4 is provided with a plurality of positioning grooves 402 in compliance with the positioning columns 202 of the housing 2 for engagingly securing the housing 2 onto the stiffener 4.

Figure 2:
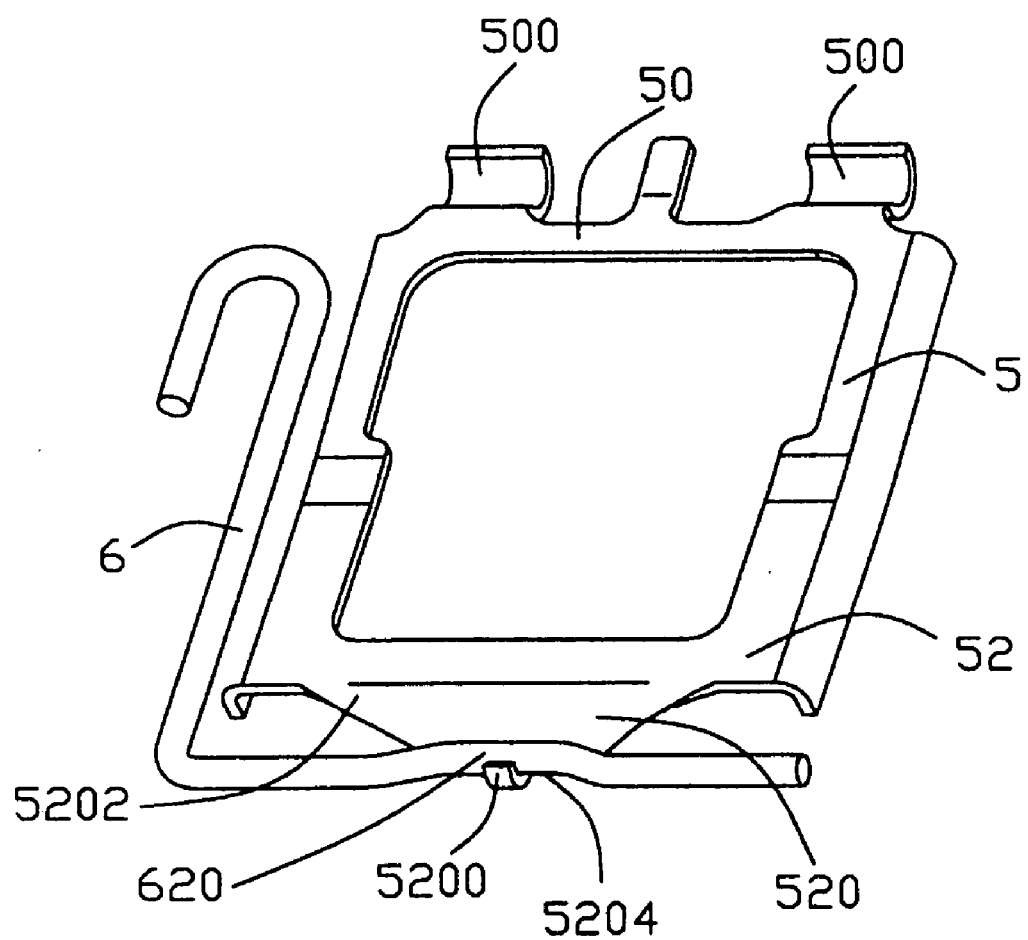
FIG. 2 depicts an assembled, isometric view of a load plate and a lever shown in FIG. 1.

Referring to FIG. 1 and FIG. 2, the planar load plate 5 comprises a connecting side 50 to be connected to the front sidewall 40 of the stiffener 4, a pressing side 52 corresponding to the rear sidewall 42 of the stiffener 4, and a pair of lateral sides 54 for jointing the connecting side 50 to the pressing side 52. The connecting side 50 forms a pair of curved latches 500 to be pivotally inserted to the latching slots 400. The pressing side 52 is provided with an arcuate hook 520 to pivotally hold the lever 6. The hook 520 extends obliquely and backwardly so as to define a partially closed latching notch 5200 to pivotally receive the lever 6.

The lever 6 is an L-shape crank comprising a retaining shaft 62 and a driving arm 60 substantially perpendicular to the driving arm 60. A handle 600 is formed at a distal end of the driving arm 60 for facilitating operation. An offset fastening section 620 is formed in a middle of the retaining shaft 62 for clasping the hook 520.

Figure 3:
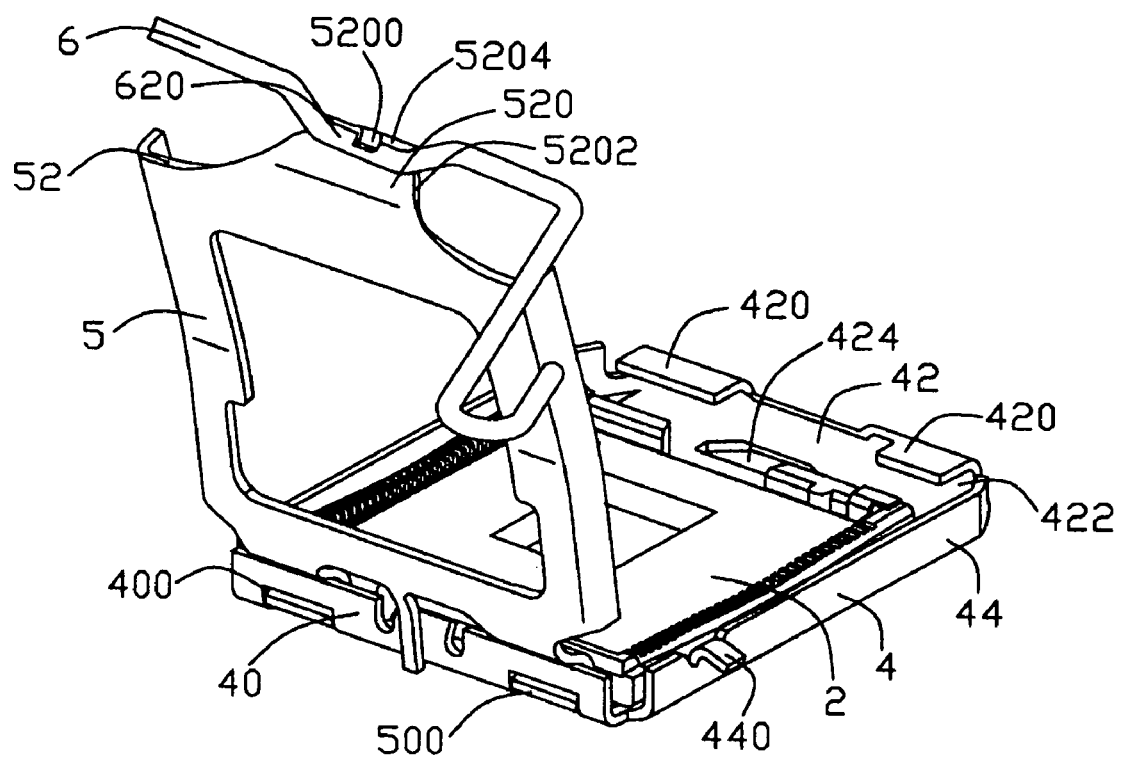
FIG. 3 depicts an assembled, isometric view of the EGA socket of FIG. 1, wherein a load plate with a lever attached thereto is oriented to an opening position.
Figure 4:
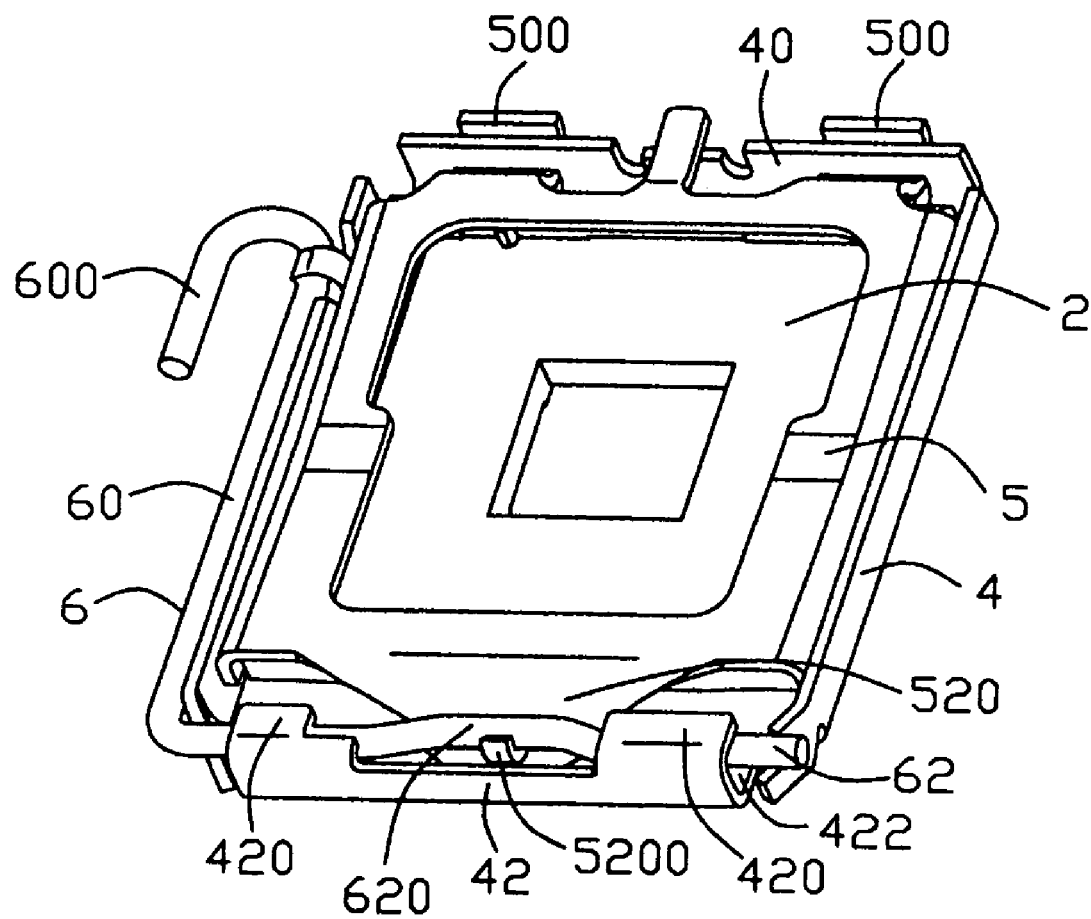
FIG. 4 is similar to FIG. 3, but showing the load plate with the lever attached thereto been oriented to a closed position.

Assembly of the LGA socket 1 will now be described in greater detail in connection with the appended drawings. As shown in FIG. 2 and FIG. 3, the fastening section 620 of the lever 6 is pivotally received in the partially closed latching notch 5200 of the hook 520, with the retaining shaft 62 being freely rotatable in the latching notch 5200. The latches 500 of the load plate 5 are inserted into the latching slots 400 of the stiffener 4, to pivotally connect the load plate 5 with the lever 6 attached thereto to the stiffener 4. The housing 2 with the conductive terminals 3 received therein is fittingly mounted in the stiffener 4 via engagement of the positioning columns 202 and the positioning grooves 402 of the stiffener 4.

In mounting of the LGA package, the load plate 5 with the lever 6 attached thereto is oriented to the opening position, where the pressing side 52 of the load plate 5 is afar from the front wall 40 of the stiffener 4. The LGA package is properly placed on the electrical region 20 of the housing 2. The load plate 5 with lever 6 attached thereto is rotated to the closed position, where the load plate 5 resists against an upper surface of the LGA package. The lever 6 is driven to rotate with respect to the hook 520 until the retaining shaft 62 abuts against the clasping ribs 420 of the stiffener 4. The driving arm 60 of the lever 6 is further urged so as to press down the load plate 5 and lock the LGA package in the closed position, wherein the driving arm 60 is held under the locking block 440.

In mounting of the LGA package, the load plate 5 with the lever 6 attached thereto is simultaneously oriented to the opening position. After the LGA package is placed on the LGA socket 1, the load plate 5 with the lever 6 attached thereto is simultaneously urged to the closed position where the load plate 5 resists an upper surface of the LGA package. The lever 6 pivotally attached to the hook 520 of the load plate 5 is driven to abut against the clasping ribs 420 so as to securely hold the LGA package on the LGA socket 1. Consequently, it is convenient and easy to mount the LGA package on the LGA socket 1.

It should be noted that the LGA socket 1 of the present invention may be realized in other manners. For example, in an alternative form, the housing 2 and the stiffener 4 may be integrally molded as a single socket body, designated as a whole as 10 in FIG. 1, and the clasping ribs 420 and the latching slots 400 are provided at two opposite ends of the single socket body. In addition, the hook 520 can be configured to other shapes as long as it can ensure secure retaining and free rotation of the lever 6.

While the present invention has been described with reference to specific embodiment, the description of the invention is illustrative and is not to be construed as limiting the invention. Various of modifications to the present invention can be made to the preferred embodiment by those skilled in the art without departing from the true spirit and scope of the invention as defined by the appended claims.

What is claimed is:

1. A land grid array (LGA) socket comprising:
   a socket body defining a plurality of passages extending therethrough and forming a pair of clasping ribs at a side thereof;
   a plurality of conductive terminals residing in corresponding passages, respectively;
   a load plate having a hook pivotally attached to the socket body, the load plate being moveable relative to the socket body between an opening position and a closed position; and
   a lever pivotally connected to the hook, the lever being rotatable relative to the hook so as to abut against the clasping ribs of the socket body and successively lock the load plate in position.

2. The LGA socket of claim 1, wherein the socket body comprises a housing and a stiffener disposed around the housing, and the load plate is pivotally assembled to one side of the stiffener while the clasping ribs are formed at another side of the stiffener.

3. The LGA socket of claim 2, wherein the clasping ribs are spaced from each other and bent inwardly towards the housing.

4. The LGA socket of claim 1, wherein the hook generally takes on an arcuate configuration and defines a partially closed latching notch to hold the lever.

5. The LGA socket of claim 1, wherein the lever comprises a retaining shaft to engage with the clasping ribs and a driving arm extending from one end of the retaining shaft, the retaining shaft is formed with an offset pressing section at a center thereof to rotate relative to the hook of the load plate.

6. The LGA socket of claim 5, wherein the socket body forms a locking block for holding the driving arm of the lever thereunder.

7. A method for assembling an electrical connector comprising the steps of:
   (a) providing a socket body planted with a plurality of conductive terminals and defining a receiving space;
   (b) providing a load plate having a hook and a lever comprising a retaining shaft and a driving arm extending from one end of the retaining shaft;
   (c) pivotally attaching the retaining shaft of the lever to the hook, with the driving arm being rotatable about the retaining shaft so as to urge the retaining shaft to be held in the receiving space and successively lock the load plate in position; and (d) pivotally mounting the load plate with the lever attached thereon to the socket body.

8. The method for assembling an electrical connector of claim 7, wherein in step (a), the socket body comprises a housing and a stiffener set around the housing.

9. The method for assembling an electrical connector of claim 8, wherein the stiffener forms a pair of clasping ribs bent inwardly towards the housing and the receiving space is enclosed by the clasping ribs and a bottom of the stiffener.

10. The method for assembling an electrical connector of claim 7, wherein in step (b), the hook of the load plate generally takes on an arcuate shape and defines a partially closed latching notch to hold the lever.

11. The method for assembling an electrical connector of claim 7, wherein in step (b), the retaining shaft of the lever is formed with an offset pressing section at a center thereof to rotate with respect to the hook of the load plate.

12. The method for assembling an electrical connector of claim 7, wherein in step (a), the socket body forms a locking block for holding the driving arm of the lever thereunder.

13. A land grid array (LGA) socket comprising:
a socket body defining a plurality of passages extending therethrough and forming at least one clasping rib at a side thereof;
a plurality of conductive terminals residing in corresponding passages, respectively;
a load plate having a hook and pivotally attached to the socket body, the load plate being moveable relative to the socket body between an opening position and a closed position; and
a lever defining two shaft sections axially offset from each other, one of said shaft sections attached to the hook, and the other of said shaft sections upwardly engaged with the clasping rib when said load plate is located in the closed position while unengaged from the clasping rib when said load plate is located in the opening position.

14. The socket as claimed in claim 13, wherein said other of the shaft sections further is downwardly engaged with a portion of said socket body.

15. The socket as claimed in claim 14, wherein said hook and said portion of the socket body are located by two sides of said clasping rib.

\* \* \* \* \*